US012599025B2

(12) United States Patent
Huang

(10) Patent No.: US 12,599,025 B2
(45) Date of Patent: Apr. 7, 2026

(54) CHIP PACKAGING METHOD INVOLVING FABRICATION OF WIRE BOND AND ELECTROPLATED METAL BONDING PAD THROUGH FORMATION OF METAL GASKET, PASSIVATION LAYER, METAL SEED LAYER, AND PHOTORESIST

(71) Applicants:CHIPMORE TECHNOLOGY CORPORATION LIMITED, Suzhou (CN); HEFEI CHIPMORE TECHNOLOGY CO., LTD., Heifei (CN)

(72) Inventor: Wenjie Huang, Suzhou (CN)

(73) Assignees: CHIPMORE TECHNOLOGY CORPORATION LIMITED, Suzhou (CN); HEFEI CHIPMORE TECHNOLOGY CO., LTD., Heifei (CN)

( * ) Notice: Subject to any disclaimer, the term of this patent is extended or adjusted under 35 U.S.C. 154(b) by 372 days.

(21) Appl. No.: 18/267,197

(22) PCT Filed: Nov. 23, 2021

(86) PCT No.: PCT/CN2021/132271
§ 371 (c)(1),
(2) Date: Jun. 14, 2023

(87) PCT Pub. No.: WO2022/142864
PCT Pub. Date: Jul. 7, 2022

(65) Prior Publication Data
US 2024/0014155 A1    Jan. 11, 2024

(30) Foreign Application Priority Data

Dec. 28, 2020    (CN) ........................ 202011579199.X

(51) Int. Cl.
H10W 72/90        (2026.01)
H10W 72/00        (2026.01)
(Continued)

(52) U.S. Cl.
CPC ......... H10W 72/90 (2026.01); H10W 72/075 (2026.01); H10W 72/50 (2026.01);
(Continued)

(58) Field of Classification Search
CPC ....... H01L 23/488; H01L 24/03; H01L 24/05; H01L 24/08; H01L 24/43; H01L 24/45;
(Continued)

(56) References Cited

U.S. PATENT DOCUMENTS

| | | | |
|---|---|---|---|
| 2001/0017412 A1 | 8/2001 | Asazu et al. | |
| 2004/0070086 A1* | 4/2004 | Lee ........................ | H01L 24/03 257/784 |
| 2014/0264952 A1* | 9/2014 | Denning ................ | H01L 24/48 257/784 |

FOREIGN PATENT DOCUMENTS

| | | |
|---|---|---|
| CN | 103811446 A | 5/2014 |
| CN | 106816417 A | 6/2017 |

(Continued)

OTHER PUBLICATIONS

International Search Report (PCT/ISA/210), issued in PCT/CN2021/132271, dated Feb. 22, 2022.

*Primary Examiner* — Wael M Fahmy
*Assistant Examiner* — Shamita S Hanumasagar
(74) *Attorney, Agent, or Firm* — Birch, Stewart, Kolasch & Birch, LLP

(57)        ABSTRACT

The present invention provides a chip packaging structure and a chip packaging method. The chip packaging structure includes a substrate, a metal bonding pad disposed on the substrate and a metal wire, wherein the tail end of the metal
(Continued)

wire is provided with a welding part, the welding part is welded to the metal bonding pad, the metal bonding pad is provided with a coating layer, and at least part of the welding part is located between the coating layer and the metal bonding pad. The present invention greatly improves a welding effect of the metal wire and the metal bonding pad, so that the welding of the metal wire and the metal bonding pad is more reliable and stable.

8 Claims, 5 Drawing Sheets

(51) Int. Cl.
    *H10W 72/50*       (2026.01)
    *H10W 72/59*       (2026.01)

(52) U.S. Cl.
    CPC ...... *H10W 72/07536* (2026.01); *H10W 72/59* (2026.01); *H10W 72/923* (2026.01); *H10W 72/952* (2026.01)

(58) Field of Classification Search
    CPC ................. H01L 24/85; H01L 2224/03; H01L 2224/04042; H01L 2224/05; H01L 2224/08; H01L 2224/48463; H01L 2224/8592
    See application file for complete search history.

(56)              References Cited

FOREIGN PATENT DOCUMENTS

| | | | |
|---|---|---|---|
| CN | 107731772 A * | 2/2018 | ............. H01L 24/48 |
| CN | 107946201 A | 4/2018 | |
| CN | 112670257 A | 4/2021 | |

* cited by examiner

Fig. 1

| |
|---|
| Preparing a metal bonding pad, and enabling a surface of the metal bonding pad to have a solder area and a wire bonding area |

| |
|---|
| Applying solder in the solder area |

| |
|---|
| Connecting a welding part at a tail end of a metal wire into the wire bonding area |

| |
|---|
| Melting the solder by heating and enabling the solder to enter the wire bonding area, so as to form a coating layer wrapping the welding part |

Fig. 2

CHIP PACKAGING METHOD INVOLVING FABRICATION OF WIRE BOND AND ELECTROPLATED METAL BONDING PAD THROUGH FORMATION OF METAL GASKET, PASSIVATION LAYER, METAL SEED LAYER, AND PHOTORESIST

TECHNICAL FIELD

The present invention relates to the field of chip packaging technologies, in particular to a chip packaging structure and a chip packaging method.

BACKGROUND ART

At present, there are two common interconnection methods of chip packaging: wire bonding and flip chip. The wire bonding is to closely weld a metal welding wire (gold/silver/copper/aluminum, etc.) with a bonding pad on the surface of a chip by means of heat, pressure, ultrasonic waves, etc., so that the metal welding wire can establish a connecting bridge between the chip and a carrier board, which realizes electrical interconnection between the chip and the carrier board.

In a welding process of the metal welding wire and the bonding pad, the welding quality between a solder ball at the tail end of the metal welding wire and the bonding pad is often affected by the following factors: (1) the condition of fluctuation and roughness of the surface of the bonding pad; (2) the condition of oxidation or dirt on the surface of the bonding pad; (3) metal thickness and hardness of the bonding pad; and (4) parameter adjustment of a bonding process. Affected by such factors, the metal welding wire is prone to false welding, weak welding and other anomalies, which greatly affects the quality of chip packaging structures and will adversely affect the reliability of products.

Therefore, it is necessary to provide a new chip packaging structure and chip packaging method to improve the welding effect and packaging quality.

SUMMARY OF THE INVENTION

The technical problem solved by the present invention is to provide a chip packaging structure and a chip packaging method, so as to improve the welding reliability and stability in a wire bonding area.

In order to solve the above technical problem, the chip packaging structure according to the present invention includes a substrate, a metal bonding pad disposed on the substrate, and a metal wire welded with the metal bonding pad, wherein a tail end of the metal wire is provided with a welding part, the welding part is welded to a surface of the metal bonding pad, the surface of the metal bonding pad is provided with a coating layer, and the tail end of the metal wire extends into the coating layer, so that the welding part is connected with the surface of the metal bonding pad, and at least part of the welding part is located between the coating layer and the metal bonding pad.

Further, a passivation layer and a metal gasket are disposed on a surface of the substrate, the passivation layer is provided with a window corresponding to the metal gasket in position, the chip packaging structure further includes a metal seed layer connected with the metal gasket, and the metal bonding pad is disposed on one side surface of the metal seed layer away from the substrate.

Further, the coating layer is disposed in a ring shape and wraps the welding pan.

Further, the coating layer does not extend beyond the metal bonding pad in a circumferential direction.

Further, the metal bonding pad is made of one or more of metals of copper, gold, nickel and palladium.

Further, the metal gasket is an aluminum gasket; and the coating layer includes metal tin.

In order to solve the above technical problem, the present invention further provides a chip packaging method. The method includes the following steps:

preparing a metal bonding pad, and enabling a surface of the metal bonding pad to have a solder area and a wire bonding area;

applying solder in the solder area;

connecting a welding part at a tail end of a metal wire into the wire bonding area; and melting the solder by heating and enabling the solder to enter the wire bonding area, so as to form a coating layer wrapping the welding part.

Further, the solder area is disposed in a ring shape, and the wire bonding area is located on an inner side of the solder area.

Further, "preparing the metal bonding pad" includes the following steps:

providing a substrate, and sequentially preparing a metal gasket and a passivation layer on a surface of the substrate, the passivation layer being provided with a window exposing part of a surface of the metal gasket to the outside;

preparing a metal seed layer on the surface of the metal gasket and a surface of the passivation layer;

preparing a first photoresist layer on a surface of the metal seed layer;

removing the first photoresist layer at a predetermined position to form a metal bonding pad forming area at the position; and manufacturing the metal bonding pad in the metal bonding pad forming area by an electroplating method.

Further, after preparation of the metal bonding pad is completed, the preparation method further includes:

preparing a second photoresist layer covering the metal bonding pad;

removing the second photoresist layer in the solder area on the surface of the metal bonding pad;

applying the solder in the solder area by the electroplating method; and removing the remaining second photoresist layer on the surface of the metal bonding pad, so that the wire bonding area is exposed to the outside.

Compared with the prior art, in the present invention, the coating layer is disposed on the surface of the metal bonding pad, and the coating layer wraps the welding part at the tail end of the metal wire, so that the welding effect between the metal wire and the metal bonding pad is greatly improved, and the welding of the metal wire and the metal bonding pad is more reliable and stable.

BRIEF DESCRIPTION OF THE DRAWINGS

FIG. 1 is a partial schematic diagram of a chip packaging structure according to the present invention;

FIG. 2 is a schematic diagram of main steps of a chip packaging method according to the present invention;

DETAILED DESCRIPTION

Figure 3:
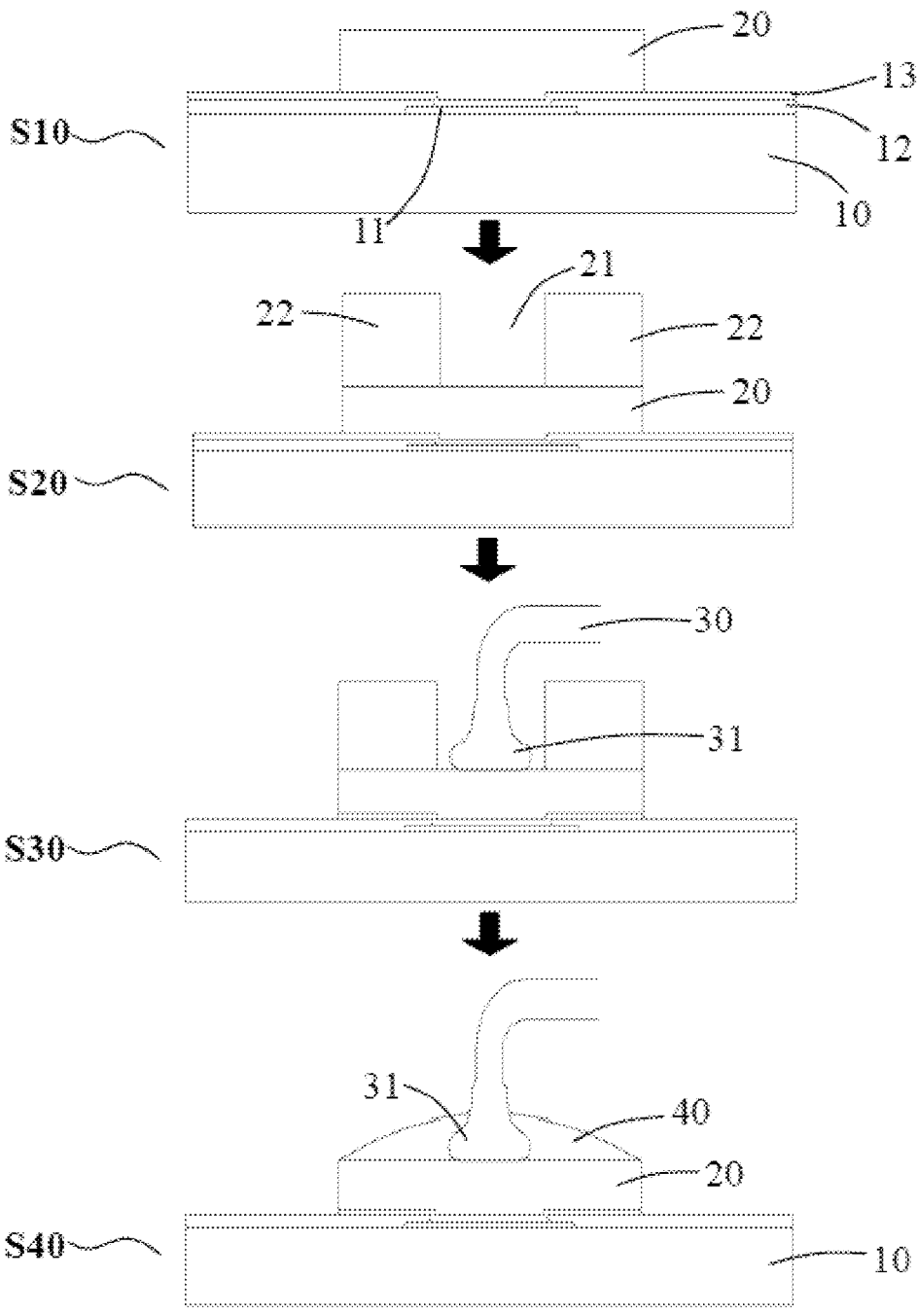
FIG. 3 is a schematic diagram of the chip packaging structure prepared by the chip packaging method in a specific embodiment of the present invention.
Figure 4:
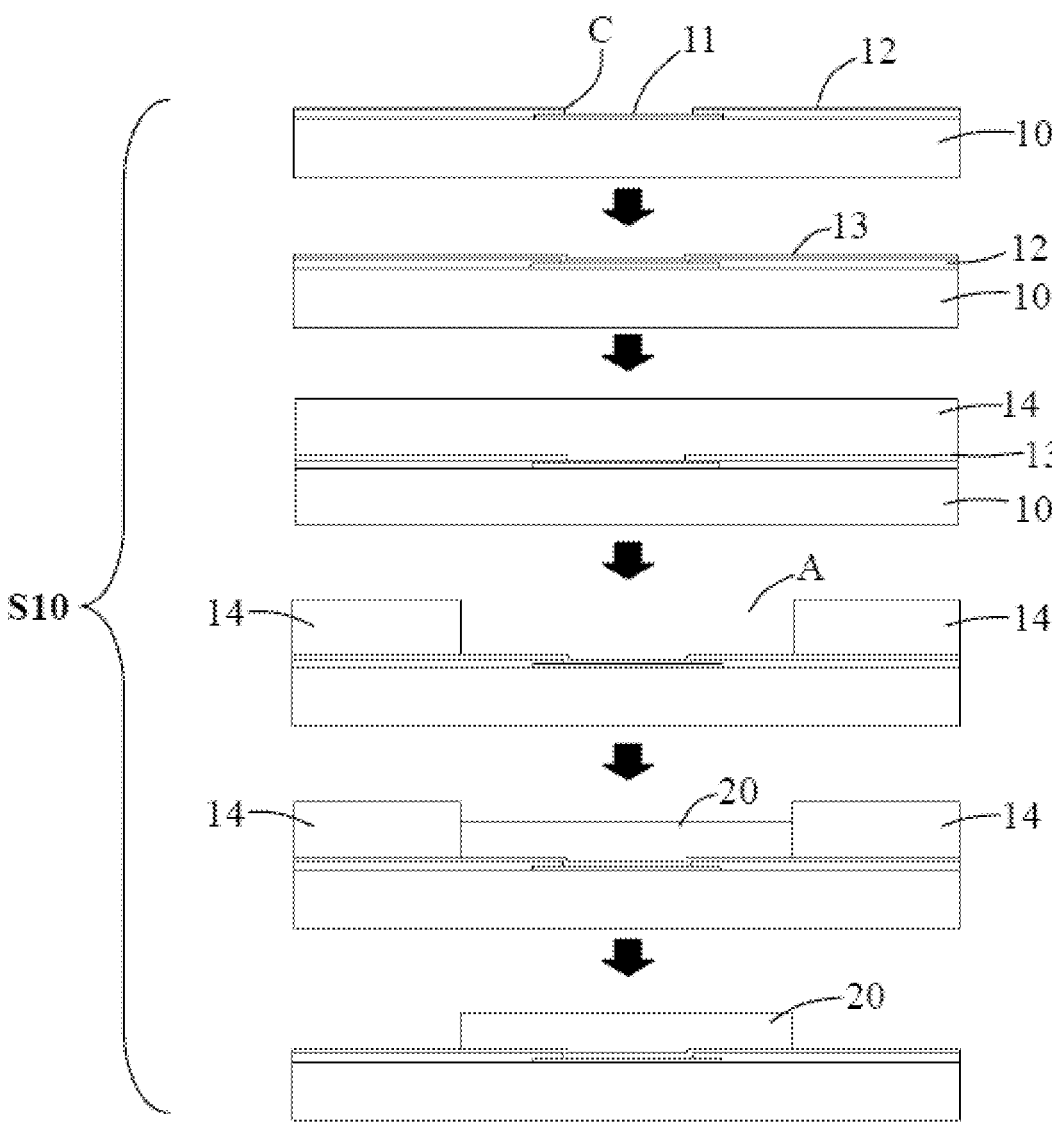
FIG. 4 is a schematic diagram of structure formation of step S10 in the chip packaging method shown in FIG. 3 according to the present invention.
Figure 5:
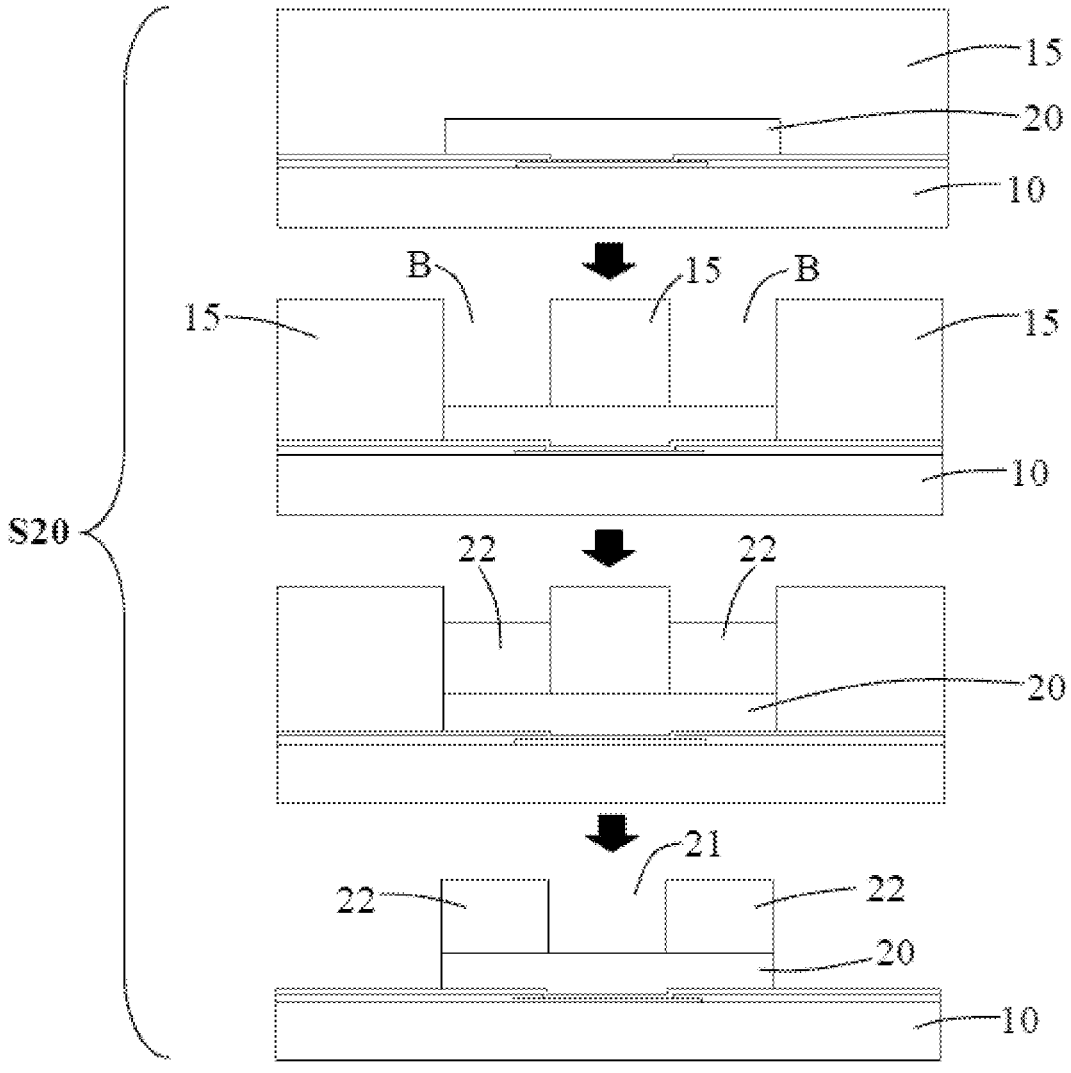
FIG. 5 is a schematic diagram of structure formation of step S20 in the chip packaging method shown in FIG. 3 according to the present invention.

The present application will be described in detail below in conjunction with the embodiments shown in the accompanying drawings. However, the present application is not limited by these embodiments, and changes in the structure, method, or function made by an ordinary person skilled in the art in accordance with these embodiments are included in the protection scope of the present application.

Referring to FIG. 1, the present invention provides a chip packaging structure, which can reliably connect a chip with an external carrier board (not shown) and has a better welding effect. Specifically, the chip packaging structure includes a substrate 10, a metal bonding pad 20 located on the surface of the substrate 10, a metal wire 30 welded and connected with the metal bonding pad 20, and a coating layer 40 covering the surface of the metal bonding pad 20, wherein the tail end of the metal wire 30 is provided with a welding part 31, the welding part 31 (which may be a solder block or a solder ball) is welded to the surface of the metal bonding pad 20, and the coating layer 40 covers the surface of the metal bonding pad 20 and wraps at least part of the welding part 31.

Preferably, the coating layer 40 is disposed in a ring shape to better wrap the welding part 31, and the coating layer 40 does not extend beyond the metal bonding pad 20 in a circumferential direction. The tail end of the metal wire 30 extends into the coating layer 40, so that the welding part 31 can be reliably and stably welded onto the metal bonding pad 20. The other end of the metal wire 30 away from the substrate 10 extends to the external carrier board and is connected with the external carrier board, so that a connection channel is established between the substrate 10 and the external carrier board via the metal wire 30.

A metal gasket 11, a passivation layer 12 and a metal seed layer 13 are also disposed between the substrate 10 and the metal bonding pad 20. The metal gasket 11 is directly formed on the substrate 10, and the passivation layer 12 covers the metal gasket 11 and is provided with a window C at the position corresponding to the metal gasket 11, so that the metal gasket 11 can be exposed in the window C. The metal seed layer 13 is directly deposited on the surfaces of the passivation layer 12 and the metal gasket 11, the upper surface of the metal seed layer 13 is in direct contact with the metal bonding pad 20, and the lower surface of the metal seed layer 13 is in direct contact with the passivation layer 12 and the metal gasket 11, thereby forming a laminated structure.

As a metal layer disposed on the surface of the substrate 10, the metal gasket 11 is preferably an aluminum gasket, and may also be made of other metals such as copper. The passivation layer 12 may be made of an inorganic thin film material such as silicon nitride and silicon oxide or an organic polymer material such as polyimide. The metal seed layer 13 may be made of copper, nickel, tin, silver, gold, aluminum and other metals. Here, the metal bonding pad 20 is an electroplating layer, which is formed above the metal seed layer 13 by an electroplating process, and may be made of one or more of metals of copper Cu, gold Au, nickel Ni and palladium Pd. For convenience of description, this electroplating layer is assumed to be a first electroplating layer. Similarly, the coating layer 40 may also be formed by preparing a second electroplating layer on the first electroplating layer by the electroplating process, and then heating and melting to form the coating layer 40. The thickness of the metal bonding pad 20 (first electroplating layer) is generally 3-30 μm.

The second electroplating layer is firstly formed on the metal bonding pad 20 (i.e., the first electroplating layer) by the electroplating process, and a wire bonding area 21 is formed on the inner side of the second electroplating layer. After the welding part 31 at the tail end of the metal wire 30 is welded into the wire bonding area 21, the welding part 31 is melted by heating, so as to wrap the welding part 31 of the metal wire in the wire bonding area 21 and the surface of the metal bonding pad 20, thereby forming the coating layer 40, which may be made of metal tin Sn. It should also be noted that the material (such as Sn) used for the coaling layer 40 is not limited to being formed on the metal bonding pad 20 by means of electroplating.

It can be seen that in the present invention, the second electroplating layer is melted at high temperature to form the coating layer 40 wrapping the welding part 31 at the tail end of the metal wire 30, so that original solder joints only in surface bonding are expanded to integral bonding, and a bonding force of the solder joints in the wire bonding area 21 is greatly improved, thereby improving the quality and reliability of products. Moreover, since the metal bonding pad 20 is prepared by the electroplating process, better surface flatness and fineness are realized, which is helpful to avoid false welding, weak welding and other anomalies that may occur in the bonding process, improves a yield of the products, and avoids the risk of customer complaints.

Aiming at the above chip packaging structure, the present invention also provides a chip packaging method which, as shown in FIGS. 2 to 6, includes at least the following steps:

preparing a metal bonding pad 20, and enabling the surface of the metal bonding pad to have a solder area B and a wire bonding area 21;

applying solder 22 in the solder area B;

connecting a welding part 31 at the tail end of a metal wire into the wire bonding area 21; and melting the solder 22 by heating and enabling the solder to enter the wire bonding area 21, so as to form a coating layer 40 wrapping the welding part 31.

The foregoing is the chip packaging method according to the present invention. In order to explain the application of the packaging method in a specific embodiment in more detail, a specific embodiment based on the above packaging method is described in detail below, as shown in FIG. 3, in this specific embodiment, the chip packaging process includes the following specific steps:

S10: preparing a metal bonding pad 20;

S20: preparing solder 22 in a solder area B on the surface of the metal bonding pad 20, and forming a wire bonding area 21 on the inner side of the solder 22;

S30: connecting a welding part 31 at the tail end of a metal wire 30 onto the metal bonding pad 20 in the wire bonding area. 21; and S40: melting the solder 22 by temperature increase to form a coating layer 40 wrapping the welding part 31.

Preferably, the solder area B is disposed in a ring shape, which surrounds the periphery of the wire bonding area 21.

The solder area B is not limited to a continuous ring shape, but may also be a ring-shaped area with notches in the circumferential direction.

In step S10, "preparing the metal bonding pad 20" specifically includes the following steps (refer to FIG. 4):

S11: providing a substrate 10, and sequentially preparing a metal gasket 11 and a passivation layer 12 on the surface of the substrate 10, the passivation layer 12 being provided with a window C exposing part of the surface of the metal gasket H to the outside;

S12: preparing a metal seed layer 13 on the surfaces of the metal gasket 11 and the passivation layer 12;

S13, preparing a first photoresist layer 14 on the surface of the metal seed layer 13, the thickness of the first photoresist layer 14 being preferably set to be higher than the metal bonding pad 20 by a predetermined height of 5-10 μm;

S14: removing the first photoresist layer 14 at a predetermined position to form a metal bonding pad forming area A at the position;

S15: preparing a first electroplating layer, namely the metal bonding pad 20, by electroplating in the metal bonding pad forming area A; and S16: removing the first photoresist layer 14 at the periphery of the first electroplating layer, so that the first electroplating layer protrudes from the surface of the substrate 10 to form the metal bonding pad 20.

"Preparing the solder 22 in the solder area B on the surface of the metal bonding pad 20 and forming the wire bonding area 21 on the inner side of the solder" in step S20 specifically includes the following steps (referring to FIG. 5):

S21: preparing a second photoresist layer 15 above the substrate 10 to completely cover the substrate 10 and the metal bonding pad 20, the thickness of the second photoresist layer 15 being also preferably set to be higher than the solder 22 by a set height of 5-10 μm;

S22: removing the second photoresist layer 15 at an edge position of the surface of the metal bonding pad 20 to form a solder area B at the edge position;

S23: applying the solder 22 in the solder area B; and

S24: removing the remaining second photoresist layer 15, forming the wire bonding area 21 in the inside area of the solder 22, and exposing the metal bonding pad 20 in the wire bonding area 21.

It is worth mentioning that preferably, the solder 22 is the second electroplating layer prepared by the electroplating process, and the component thereof is metal tin Sn, which surrounds the periphery of the wire bonding area 21.

Figure 6:
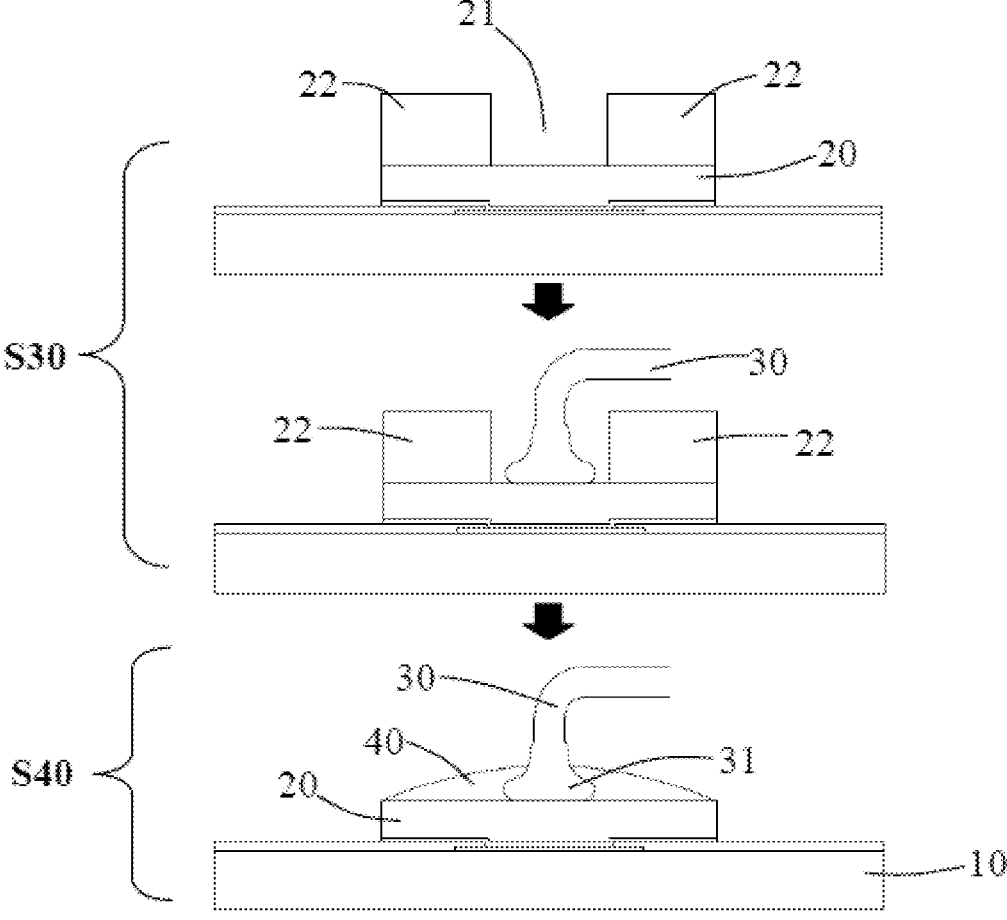
FIG. 6 is a schematic diagram of structure formation of steps S30 and S40 in the chip packaging method shown in FIG. 3 according to the present invention.

In combination with FIG. 6, "connecting the welding part 31 at the tail end of the metal wire 30 onto the metal bonding pad 20 in the wire bonding area 21" in step S30 specifically includes:

S31: removing the metal seed layer 13 in the peripheral area of the metal bonding pad 20; and S32: welding the welding part 31 at the tail end of the metal wire 30 onto the metal bonding pad 20 in the wire bonding area 21, the wire bonding area 21 being usually set in a circular shape, and a wire diameter of the metal wire 30 being usually set not to exceed ¼ of the diameter of the wire bonding area 21.

Exemplarily, the temperature increase in step S40 specifically refers to reflow soldering of the solder 22, and a peak temperature is set between 245° C. and 265° C. Due to the reflow soldering process, the solder 22 is in an environment protected by nitrogen, and if necessary, a flux may be sprayed to assist in oxide removal before reflow soldering.

According to the present invention, the metal bonding pad 20 is formed by means of electroplating, and the solder 22 is disposed on the surface of the metal bonding pad 20, so that the solder 22 surrounds the periphery of the wire bonding area 21 (that is, surrounding the periphery of the tail end of the metal wire 30). Finally, the coating layer 40 can wrap at least part of the welding part 31 at the tail end of the metal wire 30 through high temperature reflow, thereby greatly improving the welding effect between the metal wire 30 and the metal bonding pad 20 and enabling the welding of the metal wire 30 and the metal bonding pad 20 to be more reliable and stable.

In addition, it should be understood that although the description is described in terms of the embodiments, not every embodiment merely includes one independent technical solution. The statement mode of the description is merely for the sake of clarity, and those skilled should regard the description as a whole. The technical solutions in various embodiments may also be combined as appropriate to form other embodiments understandable by those skilled in the art.

The series of detailed descriptions set forth above are merely specific illustrations of feasible embodiments of the present application, and are not intended to limit the scope of protection of the present application. All equivalent embodiments or modifications that do not depart from the art spirit of the present application should fall within the scope of protection of the present application.

What is claimed is:

1. A chip packaging method, comprising the following steps:

preparing a metal bonding pad, and enabling a surface of the metal bonding pad to have a solder area and a wire bonding area;

applying solder in the solder area;

connecting a welding part at a tail end of a metal wire into the wire bonding area; and melting the solder by heating and enabling the solder to enter the wire bonding area, so as to form a coating layer wrapping the welding part, wherein the step of preparing the metal bonding pad comprises the steps of:

providing a substrate, and sequentially preparing a metal gasket and a passivation layer on a surface of the substrate, the passivation layer being provided with a window exposing part of a surface of the metal gasket to outside;

preparing a metal seed layer on the surface of the metal gasket and a surface of the passivation layer;

preparing a first photoresist layer on a surface of the metal seed layer;

removing the first photoresist layer at a predetermined position to form a metal bonding pad forming area at the position; and manufacturing the metal bonding pad in the metal bonding pad forming area by an electroplating method, and wherein after preparation of the metal bonding pad is completed, the chip packaging method further comprises the steps of:

preparing a second photoresist layer covering the metal bonding pad;

removing the second photoresist layer in the solder area on the surface of the metal bonding pad;

applying the solder in the solder area by the electroplating method; and removing the remaining second photoresist layer on the surface of the metal bonding pad, so that the wire bonding area is exposed to outside.

2. The chip packaging method according to claim 1, wherein the solder area is disposed in a ring shape, and the wire bonding area is located on an inner side of the solder area.

3. A chip packaging structure, prepared by the chip packaging method of claim 1, the chip packaging structure comprising a substrate, a metal bonding pad disposed on the substrate, and a metal wire welded with the metal bonding pad, wherein a tail end of the metal wire is provided with a welding part, the welding part is welded to a surface of the metal bonding pad, wherein the surface of the metal bonding pad is provided with a coating layer, and the tail end of the metal wire extends into the coating layer, so that the welding part is connected with the surface of the metal bonding pad, and at least part of the welding part is located between the coating layer and the metal bonding pad.

4. The chip packaging structure according to claim 3, wherein a passivation layer and a metal gasket are disposed on a surface of the substrate, the passivation layer is provided with a window corresponding to the metal gasket in position, the chip packaging structure further comprises a metal seed layer connected with the metal gasket, and the metal bonding pad is disposed on one side surface of the metal seed layer away from the substrate.

5. The chip packaging structure according to claim 4, wherein the metal gasket is an aluminum gasket; and the coating layer comprises metal tin.

6. The chip packaging structure according to claim 3, wherein the coating layer is disposed in a ring shape and wraps the welding part.

7. The chip packaging structure according to claim 3, wherein the coating layer does not extend beyond the metal bonding pad in a circumferential direction.

8. The chip packaging structure according to claim 3, wherein the metal bonding pad is made of one or more of metals of copper, gold, nickel and palladium.

\* \* \* \* \*